(12) United States Patent
Nazarian et al.

(10) Patent No.: US 10,957,410 B1
(45) Date of Patent: Mar. 23, 2021

(54) METHODS AND APPARATUS FOR FACILITATED PROGRAM AND ERASE OF TWO-TERMINAL MEMORY DEVICES

(71) Applicant: Crossbar, Inc., Santa Clara, CA (US)

(72) Inventors: Hagop Nazarian, San Jose, CA (US); Sang Nguyen, Union City, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 16/291,396

(22) Filed: Mar. 4, 2019

Related U.S. Application Data

(60) Provisional application No. 62/637,736, filed on Mar. 2, 2018.

(51) Int. Cl.
*G11C 16/34* (2006.01)
*G11C 29/12* (2006.01)
*G11C 11/56* (2006.01)
G11C 29/44 (2006.01)

(52) U.S. Cl.
CPC ...... *G11C 16/3445* (2013.01); *G11C 11/5635* (2013.01); *G11C 29/12* (2013.01); *G11C 2029/4402* (2013.01)

(58) Field of Classification Search
CPC . G11C 16/3445; G11C 29/12; G11C 11/5635; G11C 2029/4402
See application file for complete search history.

(56) References Cited

U.S. PATENT DOCUMENTS

| | | | | |
|---|---|---|---|---|
| 6,457,174 B1* | 9/2002 | Kuroda | ........... | G06F 8/54 711/221 |
| 8,248,853 B2* | 8/2012 | Lee | ........... | G11C 16/3427 365/185.17 |
| 8,861,298 B2* | 10/2014 | Shibata | ........... | G11C 16/0483 365/226 |
| 9,373,410 B1* | 6/2016 | Kumar | ........... | G11C 17/146 |
| 9,640,265 B1* | 5/2017 | Honma | ........... | G11C 11/5628 |
| 2006/0256620 A1* | 11/2006 | Nguyen | ........... | G11C 16/10 365/185.28 |
| 2007/0189105 A1* | 8/2007 | Yoon | ........... | G11C 16/26 365/230.08 |
| 2008/0158994 A1* | 7/2008 | Yang | ........... | G11C 16/0483 365/185.22 |
| 2008/0175069 A1* | 7/2008 | Wang | ........... | G11C 11/5635 365/185.29 |

(Continued)

*Primary Examiner* — Khamdan N. Alrobaie
(74) *Attorney, Agent, or Firm* — Wegman Hessler

(57) ABSTRACT

A method for facilitating erase or program operations on two-terminal memory devices includes substantially simultaneously initiating erase cycle or program cycle for two-terminal memory devices from a first plurality of two-terminal memory devices, monitoring erase detect or program detect conditions for each of the two-terminal memory devices, and before detecting erase detect or program detect conditions for all of the two-terminal memory devices, the method includes detecting an erase detect or a program detect condition for the first two-terminal memory device from the first plurality of two-terminal memory devices, and initiating an erase cycle or a program for a second two-terminal memory device for a second plurality of two-terminal memory devices, in response to detecting the erase detect or program detect condition for the first two-terminal memory device.

20 Claims, 10 Drawing Sheets

(56) References Cited

U.S. PATENT DOCUMENTS

| | | | |
|---|---|---|---|
| 2008/0192548 A1* | 8/2008 | Shibata | G11C 16/16 365/185.17 |
| 2009/0014707 A1* | 1/2009 | Lu | H01L 27/2472 257/4 |
| 2010/0085798 A1* | 4/2010 | Lu | G11C 11/56 365/148 |
| 2011/0122697 A1* | 5/2011 | Jang | G11C 16/0483 365/185.12 |
| 2012/0005414 A1* | 1/2012 | Moro | G06F 12/1433 711/103 |
| 2012/0265949 A1* | 10/2012 | Shimizu | G06F 13/1689 711/154 |
| 2014/0022842 A1* | 1/2014 | Jung | G11C 11/5628 365/185.03 |
| 2015/0263069 A1* | 9/2015 | Jo | H01L 45/085 365/148 |
| 2017/0148520 A1* | 5/2017 | Oh | G11C 16/12 |
| 2019/0163398 A1* | 5/2019 | Tokiwa | G06F 3/0659 |
| 2019/0272882 A1* | 9/2019 | Guy | G11C 11/5678 |

\* cited by examiner

METHODS AND APPARATUS FOR FACILITATED PROGRAM AND ERASE OF TWO-TERMINAL MEMORY DEVICES

CROSS-REFERENCE TO RELATED APPLICATION

The present application for patent claims the benefit of U.S. Provisional Application No. 62/637,736 filed on Mar. 2, 2018 and titled "METHODS AND APPARATUS FOR FACILITATED PROGRAM AND ERASE OF TWO-TERMINAL MEMORY DEVICES", which is hereby incorporated by reference herein in its entirety and for all purposes.

TECHNICAL FIELD

Embodiments of the present disclosure relate to two-terminal memory devices and methods; for example, various embodiments relate to methods and apparatus for facilitating bulk program or erase operations for resistive random access memory devices among other two-terminal memory devices.

BACKGROUND

Resistive-switching memory represents a recent innovation within the field of integrated circuit technology. While much of resistive-switching memory technology is in the development stage, various technological concepts for resistive-switching memory have been demonstrated by the inventor(s) and are in one or more stages of verification to prove or disprove associated theories or techniques. The inventor(s) believe that resistive-switching memory technology shows compelling evidence to hold substantial advantages over competing technologies in the semiconductor electronics industry.

The inventor(s) believe that resistive-switching memory cells can be configured to have multiple states with measurably distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell can be correlated with logical information states, facilitating digital memory operations. Accordingly, the inventor(s) believe that arrays of many such memory cells can provide many bits of digital memory storage.

The inventor(s) have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventor(s) have put forth several proposals for practical utilization of resistive-switching technology to memory applications for electronic devices. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, continued development of practical utilizations of resistive-switching technology are pursued by the Assignee of the present disclosure.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Some embodiments are directed to filamentary-based resistive random access (ReRAM) devices under development by the assignee hereof. Additional embodiments may also be applied to other types of two-terminal devices, such as oxygen vacancy memory, phase-change memory, magnetic memory, and the like. In various embodiments, by convention, an erase state is associated with a high resistance state, and a program state is associated with a low resistance state, although other conventions are within the scope of the present disclosure. When a read voltage or current is applied to the ReRAM device, an erase state for the ReRAM device is detected with a low current flow (e.g., relative to a preset threshold), and a program state for the ReRAM is detected with a higher current flow (e.g., also relative to the threshold).

According to one aspect, a method for facilitating erase or program operations on two-terminal memory devices is described. One technique includes substantially simultaneously initiating erase cycle or program cycle for two-terminal memory devices from a first plurality of two-terminal memory devices, and monitoring erase detect or program detect conditions for each of the two-terminal memory devices. In various embodiments, substantially simultaneously as used in relation to electronic memory operations can be defined as, e.g., concurrent application of power signals, initiation of power signals within a same clock cycle controlling current or voltage circuitry for implementing memory operations on the two-terminal memory devices, or within an adjacent clock cycle, or the like. One process includes before detecting erase detect or program detect conditions for all of the two-terminal memory devices: detecting an erase detect or a program detect condition for the first two-terminal memory device from the first plurality of two-terminal memory devices, and initiating an erase cycle or a program for a second two-terminal memory device for a second plurality of two-terminal memory devices, in response to detecting the erase detect or program detect condition for the first two-terminal memory device.

According to another aspect, a semiconductor device is described. An apparatus includes a first plurality of two-terminal memory devices, and a second plurality of two-terminal memory devices. A system may include a state adjustment initiation portion coupled to the first plurality of two-terminal memory devices and to the second plurality of two-terminal memory devices, wherein the state adjustment initiation portion is configured to substantially initiate bringing each two-terminal memory device from the first plurality of two-terminal memory devices to a pre-determined state, wherein the pre-determined state is selected from a group consisting of: erase state and program state, and a detection portion coupled to the first plurality of two-terminal memory devices and to the state adjustment initiation portion, wherein the detection portion is configured to simultaneously detect whether an adjustment success condition occurs for every two-terminal memory device from the first plurality of two-terminal memory devices. In various embodiments, the state adjustment initiation portion is also configured to initiate bringing a first two-terminal memory device from the second plurality of two-terminal memory devices to the pre-determined state, in response to detection of an adjustment success condition occurs for a second two-terminal memory device from the first plurality of two-terminal memory devices and before detection of adjustment success conditions for all two-terminal memory device from the first plurality of two-terminal memory devices.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
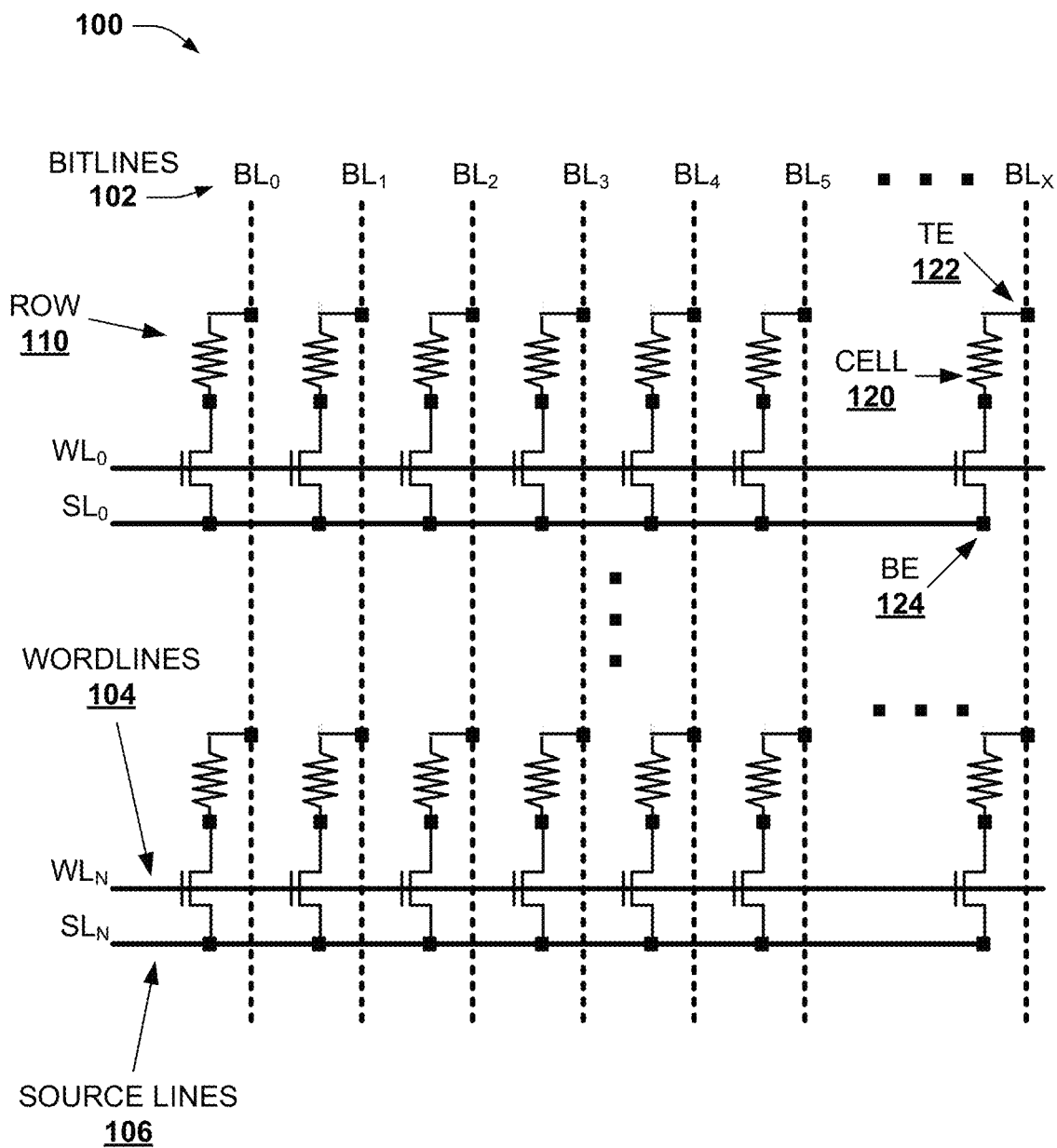
FIG. 1 illustrates an example circuit diagram of arrays of two-terminal memory devices for implementing aspects of the present disclosure, in an embodiment.

As the name implies, two-terminal memory device has two terminals or electrodes. Herein, the terms "electrode" and "terminal" are used interchangeably. Generally, a first electrode of two-terminal memory is referred to as a "top electrode" (TE) and a second electrode of the two-terminal memory is referred to as a "bottom electrode" (BE), although it is understood that electrodes of two-terminal memory device can be according to any suitable arrangement, including a horizontal arrangement in which components of a memory cell are (substantially) side-by-side rather than overlying one another. Situated between the TE and BE of a two-terminal memory device is typically an interface layer sometimes referred to as a switching layer, a resistive switching medium (RSM) or a resistive switching layer (RSL). When incorporating a RSM, the two-terminal memory device can be referred to as a (two-terminal) resistive switching device. Various embodiments of the present disclosure provide a two-terminal resistive switching device connected to multiple components at one of the two-terminals, resulting in a three-terminal non-volatile memory cell.

Composition of memory cells, generally speaking, can vary per device with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, metal-alloy, metal-nitride, (e.g., comprising TiN, TaN, TiW, or other suitable metal compounds), an optional interface layer (e.g., doped p-type (or n-type) silicon (Si) bearing layer (e.g., a p-type or n-type Si bearing layer, p-type or n-type polysilicon, p-type or n-type polycrystalline SiGe, etc.)), a resistive switching layer (RSL) and an active metal-containing layer capable of being ionized. Under suitable conditions, the active metal-containing layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer. A memory cell having such characteristics may be described as a filamentary-based device.

A RSL (which can also be referred to in the art as a resistive switching media (RSM)) can comprise, e.g., an undoped amorphous Si-containing layer, a semiconductor layer having intrinsic characteristics, a silicon nitride (e.g., SiN, Si3N4, SiNx, etc.), a Si sub-oxide (e.g., SiOx wherein x has a value between 0.1 and 2), a Si sub-nitride, a metal oxide, a metal nitride, a non-stoichiometric silicon compound, and so forth. Other examples of materials suitable for the RSL could include $Si_xGe_yO_z$ (where x, y and z are respective suitable positive numbers), a silicon oxide (e.g., SiON, where N is a suitable positive number), a silicon oxynitride, an undoped amorphous Si (a-Si), amorphous SiGe (a-SiGe), TaOB (where B is a suitable positive number), HfOC (where C is a suitable positive number), TiOD (where D is a suitable number), Al2OE (where E is a suitable positive number) and so forth, a nitride (e.g. AlN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Because of the few particle-trapping voids/defects, a conductive filament formed in such an RSL can be quite thin, and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, oxides, alloys, or combinations of the foregoing or similar materials can be employed for the active metal-containing layer in some aspects of the subject disclosure. Further, a non-stoichiometric compound, such as a non-stoichiometric metal oxide or metal nitride (e.g., AlOx, AlNx, CuOx, CuNx, AgOx, AgNx, and so forth, where x is a suitable positive number $0<x<2$, which can have differing values for differing ones of the non-stoichiometric compounds) or other suitable metal compound can be employed for the active metal-containing layer, in at least one embodiment.

In one or more embodiments, a disclosed filamentary resistive switching device can include an active metal layer comprising a metal nitride selected from the group consisting of: TiNx, TaNx, AlNx, CuNx, WNx and AgNx, where x is a positive number. In a further embodiment(s), the active metal layer can comprise a metal oxide selected from the group consisting of: TiOx, TaOx, AlOx, CuOx, WOx and AgOx. In yet another embodiment(s), the active metal layer can comprise a metal oxi-nitride selected from the group consisting of: TiOaNb, AlOaNb, CuOaNb, WOaNb and AgOaNb, where a and b are positive numbers. The disclosed filamentary resistive switching device can further comprise a switching layer comprising a switching material selected from the group consisting of: SiOy, AlNy, TiOy, TaOy, AlOy, CuOy, TiNx, TiNy, TaNx, TaNy, SiOx, SiNy, AlNx, CuNx, CuNy, AgNx, AgNy, TiOx, TaOx, AlOx, CuOx, AgOx, and AgOy, where x and y are positive numbers, and y is larger than x. Various combinations of the above are envisioned and contemplated within the scope of embodiments of the present invention.

In one example, a disclosed filamentary resistive switching device comprises a particle donor layer (e.g., the active metal-containing layer) comprising a metal compound and a resistive switching layer. In one alternative embodiment of this example, the particle donor layer comprises a metal nitride: MNx, e.g., AgNx, TiNx, AlNx, etc., and the resistive switching layer comprises a metal nitride: MNy, e.g., AgOy, TiOy, AlOy, and so forth, where y and x are positive numbers, and in some cases y is larger than x. In an alternative embodiment of this example, the particle donor layer comprises a metal oxide: MOx, e.g., AgOx, TiOx, AlOx, and so on, and the resistive switching layer comprises a metal oxide: MOy, e.g., AgOy, TiOy, AlOy, or the like, where y and x are positive numbers, and in some cases y is larger than x. In yet another alternative, the metal compound of the particle donor layer is a MNx (e.g., AgNx, TiNx, AlNx, etc.), and the resistive switching layer is selected from a group consisting of MOy (e.g., AgOy, TiOy, AlOy, etc.) and SiOy, where x and y are typically non-stoichiometric values, or vice versa in a still further embodiment.

As utilized herein, variables x, a, b, and so forth representative of values or ratios of one element with respect to another (or others) in a compound can have different values suitable for respective compounds, and are not intended to denote a same or similar value or ratio among the compounds. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, and the following U.S. patent application assigned to the assignee of the present application for patent: application Ser. No. 14/588,185 filed Dec. 31, 2014; each of the foregoing patent applications are hereby incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

In various embodiments, filamentary-based resistance switching devices can operate in a bipolar fashion, behaving differently in response to different polarity (or direction, energy flow, energy source orientation, etc.) external stimuli. For the volatile filamentary-based selector device, as an illustrative example, in response to a first polarity stimulus exceeding a first threshold voltage (or set of voltages), the filamentary selector device can change to a second resistance state from a first resistance state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For bipolar operation of a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state. More specifically, the trapped metal particles provide the conductive path or filament through the non-volatile RSL layer, and the resistance is typically determined by a tunneling resistance through the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

As mentioned above, applying a program voltage (also referred to as a "program pulse") to one of the electrodes of the two-terminal memory can cause a conductive filament to form in an interface layer (e.g., a RSL). By convention and as generally described herein, the TE receives the program pulse and the BE is grounded (or held at lower voltage or opposite polarity compared to the program pulse), but such is not intended to be limiting for all embodiments. Conversely, applying an "erase pulse" to one of the electrodes (generally a pulse of opposite polarity as the program pulse or to the opposite electrode as the program pulse) can break continuity of the filament, e.g., by driving the metal particles or other material that forms the filament back toward the active metal source. Properties of this conductive filament as well as its presence or absence affect the electrical characteristics of the two-terminal memory cell such as, for example, lowering the resistance and/or increasing conductance across the two terminals when the conductive filament is present as opposed to when not present.

Following program or erase pulses, a read pulse can be asserted. This read pulse is typically lower in magnitude relative to program or erase pulses and typically insufficient to affect the conductive filament and/or change the state of the two-terminal memory cell. By applying a read pulse to one of the electrodes of the two-terminal memory, a measured current (e.g., Ion) when compared to a predetermined threshold current can be indicative of the conductive state of the two-terminal memory cell. The threshold current can be preset based on expected current values in different states (e.g., high resistance state current; respective currents of one or more low resistance states, and so forth) of the two-terminal memory device, suitable for a given two-terminal memory technology. For example, when the conductive filament has been formed (e.g., in response to application of a program pulse), the conductance of the cell is greater than otherwise and the measured current (e.g., Ion) reading in response to the read pulse will be greater. On the other hand, when the conductive filament is removed (e.g., in response to application of an erase pulse), the resistance of the cell is high because the interface layer has a relatively high electrical resistance, so the conductance of the cell is lower and the measured current (e.g., Ioff) reading in response to the read pulse will be lower. By convention, when the conductive filament is formed, the memory cell is said to be in the "on-state" with a high conductance. When the conductive filament is not extant, the memory cell is said to be in the "off-state". A memory cell being in the on-state or the off-state can be logically mapped to binary values such as, e.g., "1" and "0". It is understood that conventions used herein associated with the state of the cell or the associated logical binary mapping are not intended to be limiting, as other conventions, including an opposite convention can be employed in connection with the disclosed subject matter. Techniques detailed herein are described and illustrated in connection with single-level cell (SLC) memory, but it is understood that the disclosed techniques can also be utilized for multi-level cell (MLC) memory in which a single memory cell can retain a set of measurably distinct states that represent multiple bits of information.

By mapping digital information to non-volatile resistance states of a two-terminal memory cell, digital information can be stored at such device. An electronic device containing many of these two-terminal memory cells can likewise store significant quantities of data. High density arrays are configured to contain as many memory cells as possible for a given area of chip space, thereby maximizing data storage capacity of a memory chip, or system-on-chip device.

For two-terminal memory formed at intersections of metal lines within a wafer (e.g., a crossbar array), the inventor(s) of the subject disclosure are cognizant of two general conventions for arrangement of the memory cells. A first convention is the 1T1R memory array, in which each memory cell is isolated from electrical effects (e.g., current, including leak path current(s)) of surrounding circuitry by an associated transistor. A second convention is the 1TnR memory array (n being a positive number greater than one), where a group of multiple memory cells is isolated from electrical effects of surrounding circuitry by one (or more) transistors. In the 1T1R context, individual memory cells can be configured to have high current suppression between memory cells, significantly reducing leakage path currents for the 1T1R memory array.

One example mechanism for connecting a 1T1R memory array is provided. A first terminal of a two-terminal resistive memory device can be connected to a drain of a transistor. A second terminal of the two-terminal resistive memory device can be connected to a bitline of the 1T1R memory array. The source of the transistor is grounded or used as a source for erase or program signals, depending on erase/programming conditions for the memory array.

Example Memory Architecture(S) for Improved Program or Erasing of Two-Terminal Memory Devices Some embodiments of the present disclosure include increasing the read or erase bandwidth by implementing asynchronous program or erase operations for multiple two-terminal (e.g. resistive random access) memory devices (ReRAM devices). In some embodiments, program or erase operations are applied to ReRAM devices from a group of ReRAM devices at substantially the same time, however the inventors have recognized that these operations may actually complete at different times in some instances. In one example, an erase operation is driven by a single charge pump to multiple (e.g. 16) ReRAM devices concurrently, but some (e.g. two) of the ReRAM devices may program quicker than the remaining ReRAM devices. Accordingly, embodiments of the present disclosure provide for, instead of waiting until these program or erase operations for the remaining (e.g. 14) ReRAM devices to complete, to begin program or erase operations for other (e.g. two other) ReRAM devices in another group of such devices. As an example of the above, erase operations are started at about the same time (e.g., concurrently, within a common clock cycle, within an adjacent clock cycle, etc.) for a first ReRAM device and a second ReRAM device; the erase operation for the first ReRAM device completes; then, before an erase operation for the second ReRAM completes, an erase operation is started for a third ReRAM device; next, before the erase operation for the third ReRAM device completes, the erase operation for the second ReRAM device completes; subsequently, before the erase operation for the third ReRAM device completes, an erase operation is started for a fourth ReRAM device; etc. As can be seen from above, because program or erase operations complete for ReRAM devices at different times, embodiments can begin the performance of additional program or erase operations, without waiting for slower program or erase operations to complete.

In other embodiments of the present disclosure, erase or program operations on multiple ReRAM devices may be facilitated by reducing verification cycles after erase or program detection. More specifically, in initial embodiments of the present disclosure, during a typical erase cycle, an amount of current flow is detected, and when the current flow drops below a programmed or predetermined low level (e.g. 0.5 microamps (ua), 0.3 ua, or 0.1 ua, or any other suitable level appropriate for a high resistance state of a given two-terminal memory technology) an erase flag is set. In cases where the erase flag is not detected, another erase pulse is provided (or, in some embodiments, the erase pulse is maintained or continued), while the current flow is monitored; and in cases where an erase flag is set, the ReRAM device is considered erased, and the erase pulse terminated. In some embodiments, after an erase flag is detected, a verify process (read operation) is performed to verify that the ReRAM device has been erased, and if the verify process is successful, the ReRAM device is considered erased (e.g., verified as erased).

In various embodiments related to programming a ReRAM device, during a typical program cycle, an amount of current flow is detected, and when the current flow is higher than a programmed or predetermined high level (e.g. 1.0 ua, 1.3 ua, or 1.5 ua, or any other suitable level appropriate for a low resistance state (or one of a set of low resistance states) of a given two-terminal memory technology) a program flag is set. In cases where the program current level is not detected, another program pulse is provided (or the program cycle is maintained or continued), while the current flow is monitored; and in cases where a program flag is set, the ReRAM device is considered programmed, and the program pulse terminated. In some embodiments, after the program flag is detected, a verify process (read operation) is performed to verify that the ReRAM device has been programmed, and if the verify process is successful, the ReRAM device is considered programmed (e.g., verified as programmed).

In various embodiments, the verify process is considered long (e.g. 1 to 5 us), which can be up to half the duration of the erase pulse in some instances (e.g. 2 to 10 us) or program pulse (e.g. 2 to 10 us) in some cases, accordingly some embodiments of the present disclosure provide for foregoing the verify process to greatly decrease the time for erase or program processes. This is especially relevant in cases when program or erase operations are performed on multiple ReRAM devices at a time. In various embodiments, after the erase flag or program flag is detected, the erase or program pulse is terminated (e.g., without verifying the erase or program with a read process), and the ReRAM device is then considered erased or programmed.

Additional embodiments of the present disclosure include increasing the ability to detect when a ReRAM device is erased. As mentioned above, in various embodiments, to detect whether a ReRAM device is erased, a verify operation (e.g. read operation, read voltage) is applied to the ReRAM device. If properly erased, in various embodiments, a typical erase state current flow through the ReRAM device is on the order of 50 nA to 200 nA. In some embodiments, reliable sensing of this low current flow is reached at least in part by separating this low current flow from background noise. The sensing time is relatively long after the ReRAM device actually erases, because the background noise from other parts of a chip often creates interference. In other words, the noise forces the erase cycle to extend longer than it should.

In various embodiments, to reduce the effect of noise and to reduce the amount of time for an erase cycle, the present disclosure provides for biasing the current flow through the ReRAM with a bias current (e.g. background current), and then compares the combined biased current flow against a threshold current. More specifically, in some embodiments, the current flow (e.g. about 50 nA for an erased cell to about 200 nA for a programmed cell) is biased with a bias current (e.g. 1 uA to 3 uA) (for example 1 uA), and the combined biased current (e.g. about 1.05 uA for an erased cell to about 1.20 uA for a programmed cell) is sensed compared to a threshold current (e.g. about 1.12 uA. In this example, if the combined biased current is less than about 1.12 uA (e.g. about 1.05 uA for an erased cell), the cell is considered erased, and if the combined biased current is greater than 1.12 uA (e.g. about 1.20 uA for a programmed cell), the cell is considered programmed. Using such embodiments, it is believed that determining when the ReRAM device is erased can be determined more quickly than before. In other embodiments, other biasing currents, threshold currents, etc. may also be used.

Embodiments of the present disclosure may include use of one, two or all three of the above techniques and others, to facilitate erasing and programming of multiple ReRAM devices.

Referring now to the drawings, FIG. 1 illustrates a diagram of an example array 100 of two-terminal memory devices for implementing one or more embodiments of the present disclosure. In an embodiment, Array 100 can represent a single block of two-terminal memory, where a block of two-terminal memory is defined as having a first set of bitlines 102 intersecting a second set of wordlines 104 and sourcelines 106, with memory cells 120 at (schematic) intersections of the bitlines 102 and sourcelines 106. A number of bitlines 102 in a block can be set by convention, and has no absolute minimum less than 1 bitline, however as a practical matter each block will have a plurality of bitlines 102 (e.g., 8 bitlines, 32 bitlines, 128 bitlines 256 bitlines, or any suitable number there between or even larger). Rather, a block is merely a convenient descriptor for a default number of bitlines 102, wordlines 104 and sourcelines 106 which can vary in respective numbers according to one or more embodiments disclosed herein. For purposes of illustration, array 100 includes a number X bitlines (where X is a suitable integer greater than one), where bitlines 102 collectively refer to bitlines $BL_0$, $BL_1$, $BL_2$, $BL_3$, $BL_4$, $BL_5$, ... $BL_X$.

Two-terminal memory cells 120 included within array 100 are arranged in rows 110 connected to a common wordline 104 and sourceline 106. For instance, row 110 is connected to $WL_0$ and $SL_0$, whereas a another row (e.g., an $N^{th}$ row where N is a suitable integer greater than one) is connected to $WL_N$ and $SL_N$, as depicted.

Each two-terminal memory cell 120 includes a resistive switching device (designated by the resistor symbol) in series electrical connection with a transistor device (designated by the transistor symbol). A top electrode 122 of memory cell 120 shares a node with one bitline (e.g., $BL_X$) of bitlines 102, and a bottom electrode 124 of memory cell 120 shares a node with one sourceline (e.g., $WL_0$) of sourcelines 106. Additionally, a first terminal of the resistive switching device is connected to the node shared by TE 122 and $BL_X$, whereas a second terminal of the resistive witching device is connected to a drain (or source, depending on convention) of the transistor device.

To apply a program signal to a memory cell 120 in a given row 110, an activation signal (e.g., high voltage, such as 2.5 volts, or any other suitable voltage to active a transistor device selected for the transistor devices of memory cells 120, suitable for the selected transistor technology) is applied to $WL_0$. Transistor devices whose gate nodes are electrically connected to $WL_0$ are activated, allowing current to flow between the source and drain nodes of the transistors. Once the associated transistor device is activated, the second terminal of the resistive switching device of memory cell 120 is electrically connected to $SL_0$. By applying an operation voltage (or current, or electric field, or other suitable stimuli) across $BL_X$ and $SL_0$, an associated memory operation can be performed on memory cell 120. Example operations include a read operation, a write operation, and an erase operation, each having suitable voltages or voltage ranges, pulse durations, peak current values, and the like to effect these memory operations. Suitable voltage ranges for read, write and erase operations can be, e.g., 0.5v to 1.5v, 2v to 3v, −2v to −3v respectively for some resistive random access memory devices, though one of ordinary skill in the art will understand that such voltages/voltage ranges will vary as suitable for a two-terminal technology selected for memory cell 120.

In an embodiment, connecting a high voltage to $BL_X$ and a low voltage (e.g., zero volts, ground, or other suitable low voltage) to $SL_0$ while $WL_0$ is activated will program memory cell 120 to a low resistance state(s). Conversely, connecting the low voltage (e.g., zero volts, ground, etc.) to $BL_X$ and high voltage to $SL_0$ while $WL_0$ is activated will erase memory cell 120 to a high resistance state. A read operation can be implemented by connecting a moderate read voltage (e.g., small enough to not program or erase memory cell 120) to $BL_X$, the low voltage to $SL_0$ and activation voltage to $WL_0$.

Figure 2:
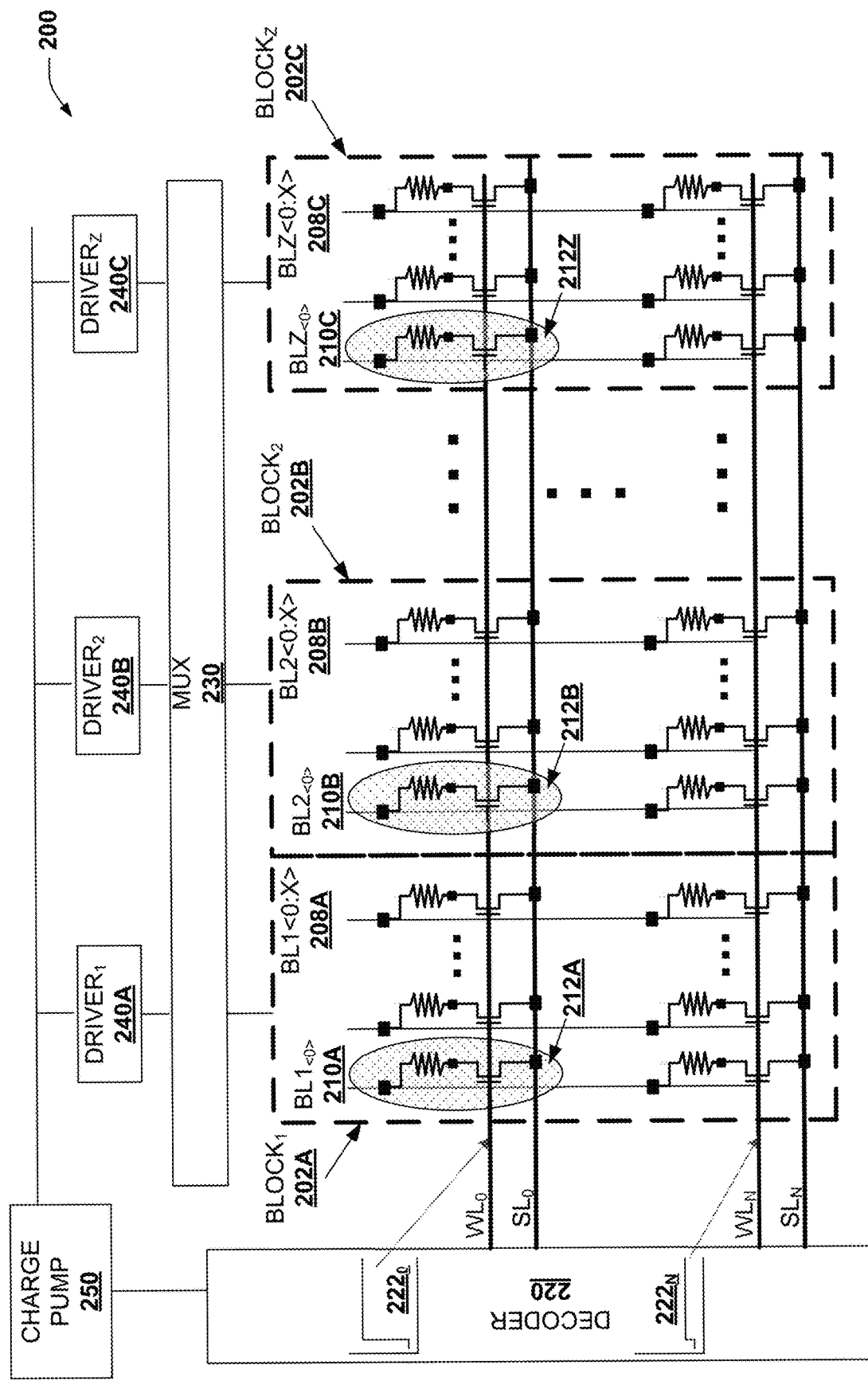
FIG. 2 depicts a sample block diagram of memory operation circuitry for operating on blocks of memory cells according to further embodiments.
Figure 3:
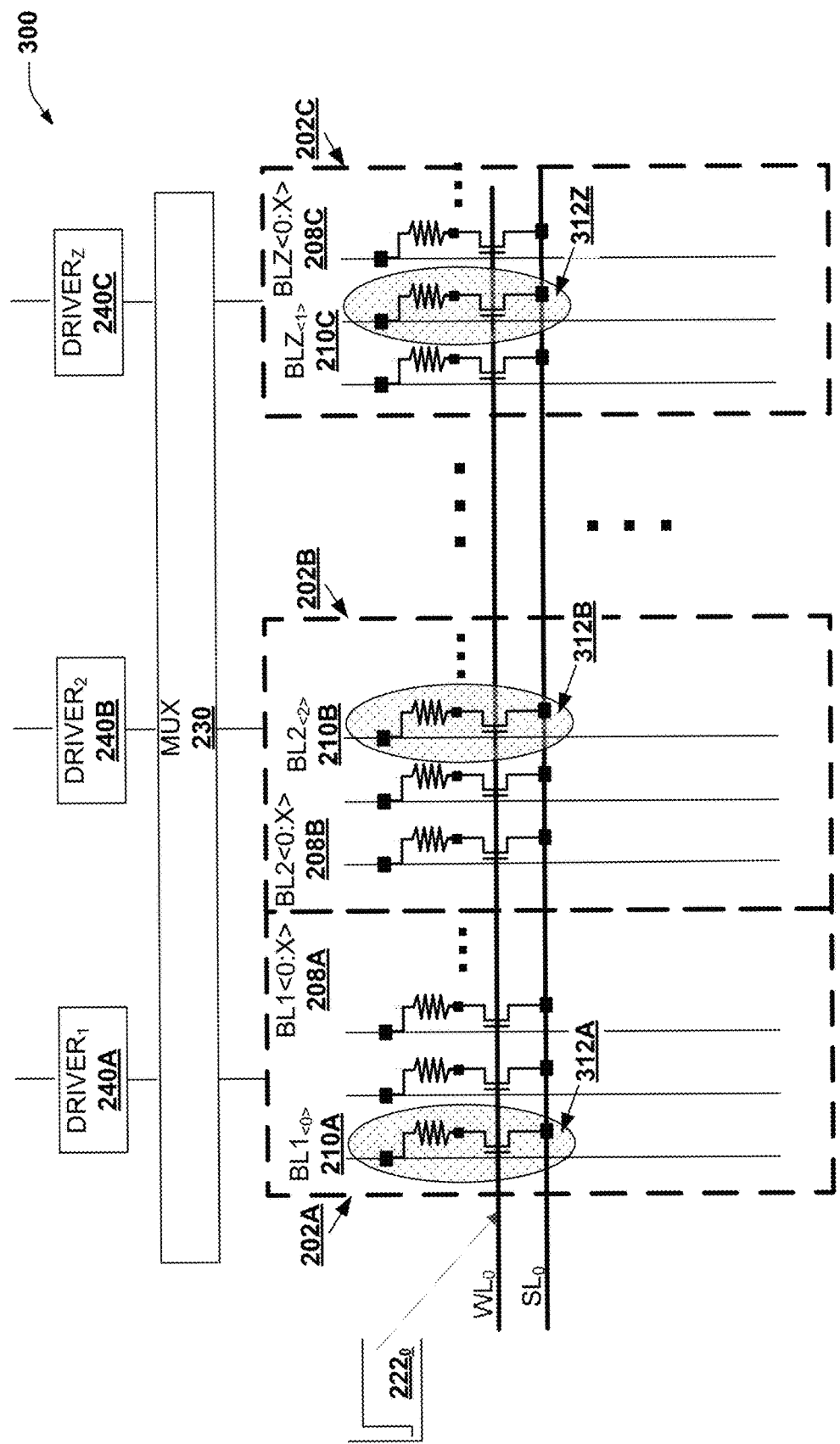
FIG. 3 illustrates a block diagram of memory operation drivers operating asychnronously with respect to other drivers, in an embodiment.
Figure 6:
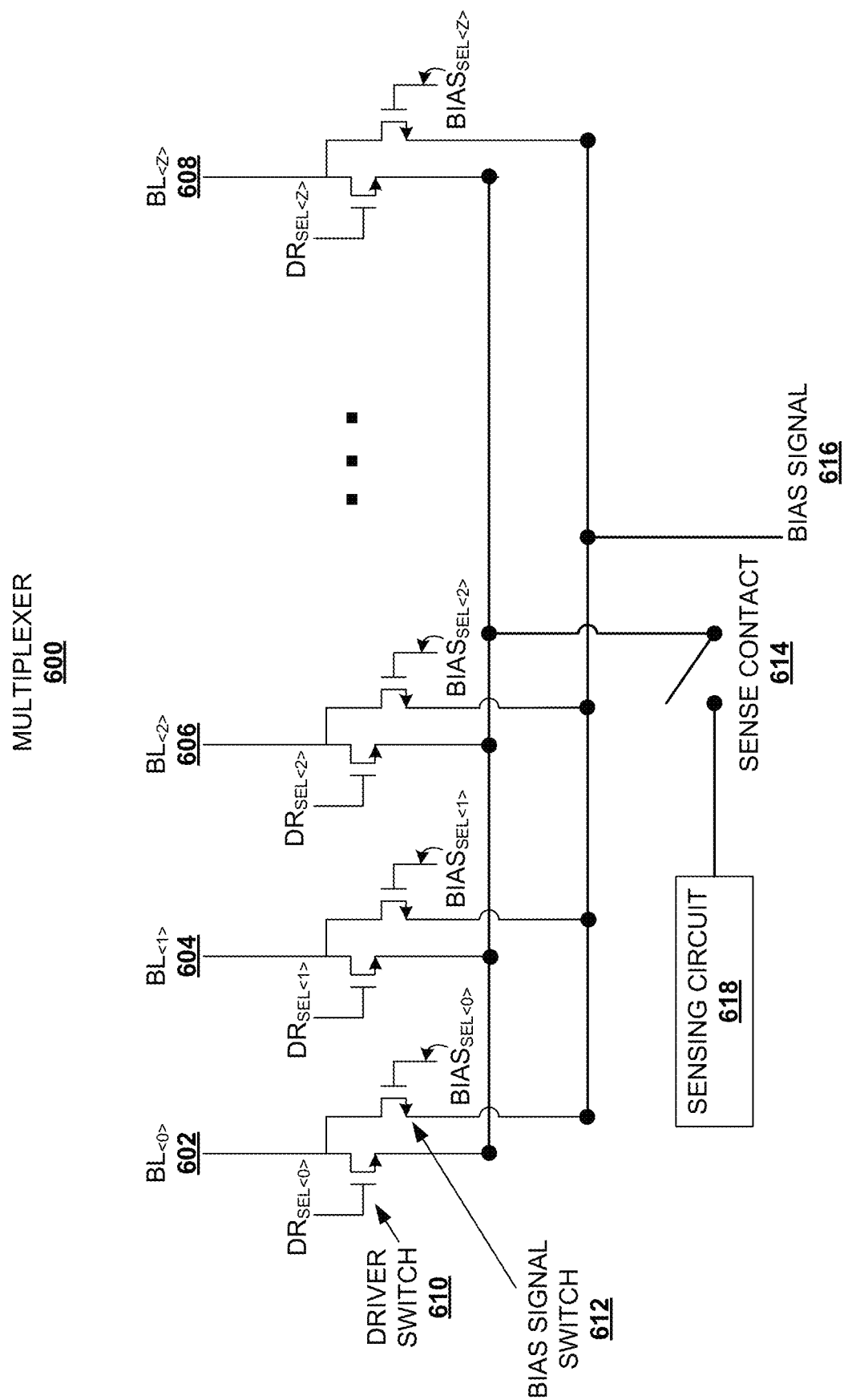
FIG. 6 depicts a schematic diagram of an example multiplexer for connecting operation drivers to different subsets of memory blocks, in an embodiment(s)

In some embodiments, a source driver can be utilized to provide suitable memory operation voltages or currents of suitable pulse durations, to effect these memory operations (e.g., see FIGS. 2 and 3, and FIG. 6, infra). Source drivers can be connected to individual bitlines of array 100 utilizing any suitable multiplexer known in the art or made known to one of skill in the art by way of the context provided herein (e.g., see FIG. 6, infra). In some embodiments, a sensing circuit can be connected to the bitline during the memory operation. In the event of a program or erase operation, the sensing circuit can be configured to set an erase flag in response to detecting a decrease in current through $BL_X$ in conjunction with an erase operation applied to memory cell 120, or can set a program flag in response to detecting an increase in current through $BL_X$ in conjunction with a program operation applied to memory cell 120. In an embodiment, a single bit can embody both the erase flag and the program flag, in which the bit is an erase bit if set (or reset, depending on convention) and a program bit if reset (or set, matching a selected convention). In other embodiments, separate bits can be provided for the erase flag and program flag.

In further embodiments, the source driver can repeat a memory operation if a program or erase bit is not set by a sensing circuit during a predefined pulse time for the memory operation. As an illustrative example, if an erase operation is initiated, and the sensing circuit does not set the erase flag before termination of the predefined pulse time, the source driver can repeat the erase operation for a given memory cell. As an alternative embodiment, the source driver can have no predefined pulse time, and can be configured to maintain the erase operation until the sensing circuit sets the erase flag, and in response thereto (e.g., in a subsequent clock cycle, or upon receipt of an erase flag setting signal, or the like), the source driver can terminate the erase operation. In yet another embodiment, a combination of the foregoing can be programmed to the source driver. For instance, the source driver can implement an erase operation(s) for a predefined pulse time, and terminate the erase operation in response to setting of the erase flag (before expiration of the pulse time, in an embodiment). Subsequent pulse time erase operations can be implemented until the erase flag is set.

In alternative or additional embodiments of the present disclosure, the source driver can be configured to verify a program or erase flag. Upon setting of the program or erase flag, the source driver terminates the program or erase operation, as applicable. A read operation can then be initiated, and current flowing through $BL_X$ connected to the memory cell 120 can be compared with an appropriate current level for the program operation, or the erase operation, as described herein. As an illustrative example, if current on $BL_X$ is measured to be greater than about 1.0 ua (or other value suitable for a given two-terminal technology, or greater than one of a set of values for a MLC two-terminal memory cell), memory cell 120 is determined to be in the program state and the program flag is verified. As another example, if current on $BL_X$ is measured to be less than about 0.5 ua (or other suitable value for a given two-terminal technology), memory cell 120 is determined to be in the erase state and the erase flag is verified. In at least some embodiments, the source driver can forego the program or erase verification, and progress to a subsequent bitline (and memory cell) in response to setting of the program flag or erase flag.

Referring now to FIG. 2, a block diagram of a memory device 200 is illustrated operable in conjunction with one or more disclosed embodiments. Memory device 200 comprises a plurality of blocks of two-terminal memory cells including Block$_1$ 202A, Block$_2$ 202B through Block$_Z$ 202C (referred to collectively as memory blocks 202A-202C). Memory blocks 202A-202C include respective pluralities of a number: X of bitlines. It should be appreciated that each block need not have the same number X of bitlines, and one or more blocks can have a different integer number (e.g., Y, where Y is a suitable number greater than zero) of bitlines. As illustrated, memory Block$_1$ 202B comprises a first plurality of X bitlines: BL1<0:X> 208A. Likewise, Block$_2$ 202B comprises a second plurality of X bitlines: BL2<0:X> 208B, up through Block$_2$ 202C that comprises a $Z^{th}$ plurality of X bitlines: BLZ<0:X> 208C (referred to collectively as bitlines 208A-208C).

Respective rows of memory cells are activated by an associated wordline, $WL_0 \ldots WL_N$. Once activated, a voltage or current can be applied across memory cell of a given memory block 202A-202C. Memory device 200 includes source drivers: driver$_1$ 240A, driver$_2$ 240B, . . . driver$_Z$ 240C (referred to collectively as source drivers 240A-240C) for applying a signal to a bitline of bitlines 208A-208C. Source drivers 240A-240C are connected to individual bitlines 208A by way of a multiplexer 230. In one embodiment, multiplexer 230 is configured to connect each source driver 240A-240C only to bitlines of an associated memory block 202A-202C. However, in some embodiments, multiplexer 230 can be configured to connect a source driver 240A (or 240B, or 240C) to any of memory blocks 202A-202C.

A charge pump 250 is provided for powering source drivers 240A-240C. Additionally, charge pump 250 can provide power to a selected wordline/sourceline pair by way of decoder 220. A high signal 220$_0$ is applied by charge pump 250 by way of decoder 220 to a selected wordline (e.g., $WL_0$), thereby activating memory cells connected to an associated sourceline (e.g., $SL_0$). A low signal 220N is applied to unselected wordlines (e.g., $WL_N$) to deactivate memory cells connected to the deactivated wordline.

Memory operations are implemented by memory device 200 by: activating a selected wordline (e.g., $WL_0$, etc.), and applying a signal across a selected bitline(s) and a sourceline (e.g., $SL_0$, etc.) associated with the selected wordline. In various embodiments, source drivers 240A-240C can initiate a memory operation on a plurality of memory cells in respective memory blocks 202A-202C substantially simultaneously (e.g., concurrently, in a common clock cycle, in an adjacent clock cycle, or other suitable convention). As defined herein, the plurality of memory cells is embodied by memory cells on the same order of bitline in different memory blocks 202A-202C. In other words, memory cells on zeroth order bitlines of each memory block, including: $BL1_{<0>}$ 210A, $BL2_{<0>}$ 210B, . . . , $BLZ_{<0>}$ 210c (referred to collectively as zeroth order bitlines 210A-210C) are included in the first plurality of memory cells. As illustrated in FIG. 2, the first plurality of memory cells include memory cells 212A, 212B, . . . , 212C (referred to collectively as plurality of memory cells 212A-212C). A second plurality of memory cells includes those memory cells on first order bitlines ($BL1_{<1>}$, $BL2_{<1>}$, $BLZ_{<1>}$) of each memory block 202A-202C, a third plurality of memory cells includes those memory cells on second order bitlines ($BL1_{<2>}$, $BL2_{<2>}$, $BLZ_{<2>}$) of each memory block 202A-202C, and so on.

To improve erase times of a block of memory cells, source drivers 240A-240C can be configured to initiate a memory operation on a first plurality of memory cells 212A-212C concurrently, but can progress to subsequent memory cells in an associated memory block 202A-202C independently. With different words, a given source driver 240A begins a bulk erase (or program) operation of memory blocks 202A-202C concurrent with source drivers 240B and 240C, but can progress to subsequent bitlines of Block$_1$ 202A independently of progression of source drivers 240B and 240C, and vice versa. This can improve bulk operation times because delays in erasing or programming a given memory cell by one source driver (e.g., 240B) will not delay progression of other source drivers (e.g., 240A, 240C) to subsequent memory cells on subsequent bitlines. Rather, once detection of a completion event occurs (e.g., setting of a program flag or erase flag, optionally in conjunction with a read verify operation) a source driver (e.g., 240A) can connect to a subsequent bitline (e.g., from $BL1_{<0>}$ to $BL1_{<1>}$) utilizing multiplexer 230. In at least one embodiment, the source driver completes all bitlines (e.g., $BL1_{<0:X>}$) in a given memory block (e.g., Block$_1$ 202A), that source driver can be connected to bitlines in a different memory block (e.g., Block$_2$ 202B, Block$_Z$ 202C) to further reduce overall time for the bulk erase (or program) operation.

Referring now to FIG. 3, there is illustrated a memory device 300 configured to perform memory operations on memory cells in different pluralities of memory cells, as provided herein. Memory device 300 can be substantially similar to memory device 200 of FIG. 2, supra, in one or more embodiments. Thus, as illustrated, memory device 300 can comprise source drivers 240A-240C, multiplexer 230, memory blocks 202A-202C, and bitlines 208A-208C as described above, as well as other components of memory device 200 not specifically depicted in FIG. 3.

A bulk memory operation is illustrated for memory device 300, in which different source drivers 240A-240C are operating on different plurality of memory cells at a time $t_a$ beyond an initiation time $t_0$, where a is an integer >0. An activation signal is supplied to $WL_0$, activating all transistors connected to $WL_0$. A suitable signal is applied to sourceline $SL_0$ to facilitate a program (e.g., low signal) or erase (e.g., high signal) for memory cells connected to $SL_0$. Source driver$_1$ 240A is still operating on a memory cell in a zeroth set of bitlines, specifically memory cell 312A connected to $BL1_{<0>}$ 210. Meanwhile, source driver$_2$ 240B has progressed to operating on a memory cell in a second set of bitlines, specifically memory cell 312B connected to BL2$_{<2>}$ 210B, and source driver$_Z$ 240C has progressed to operating on a memory cell in a first set of bitlines, specifically memory cell 312Z connected to BLZ$_{<1>}$ 210C. As illustrated by memory device 200, a long operation time for memory cell 312A does not delay operations of source driver$_2$ 240B on Block$_2$ 202B, and does not delay operations of source driver$_Z$ 240C on Block$_Z$ 202C. By configuring source drivers 240A-240C to progress to a bitline in a subsequent set of bitlines (e.g., from BLZ$_{<0>}$ to BLZ$_{<1>}$, and so forth) independently of other source drivers 240A-240C, effects of longer operation times on given memory cells can be minimized for bulk erase or bulk program operations, improving overall speed of such operations.

Figure 4:
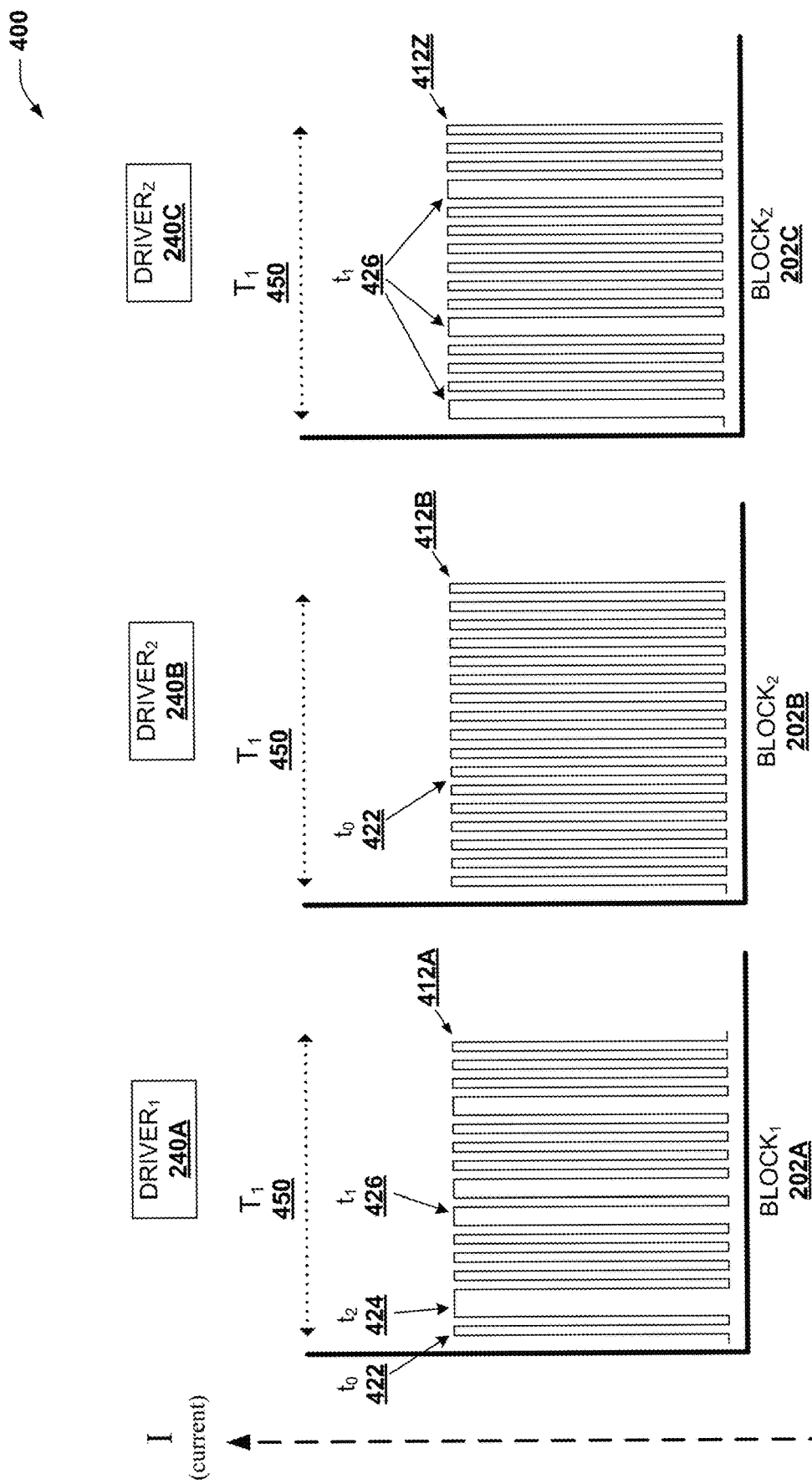
FIG. 4 depicts a diagram of possible program cycles for asynchronous drivers operating on blocks of two-terminal memory cells in further embodiments.

FIG. 4 illustrates example pulse-time diagrams 400 for blocks of memory according to additional embodiments of the present disclosure. Pulse time diagrams 400 plot current on a vertical axis and time on a horizontal axis. Further, FIG. 4 provides respective pulse time diagrams for each of blocks 202A-202C.

Each pulse has a time for successful program or erase operation on a given memory cell within an associated memory block. For Block$_1$ 202A, a variety of pulse times are illustrated depending on how long a memory cell took to complete a program or erase operation (e.g., as determined by setting of an erase flag or program flag, optionally in conjunction with a read/verify operation). A first memory cell (indicated by a first pulse for Block$_1$ 202A—starting from the left of the diagram—was programmed in a first pulse time t$_0$ 422. Pulse time t$_0$ 422 can be a default or minimum pulse time, in an embodiment. In other embodiments, a default pulse time can be provided (e.g., 20 nanoseconds, or other suitable value associated with an average, media, typical, etc., program or erase time for a given type of two-terminal memory technology employed for a memory cell), which can be cut short upon detection of a program or erase event. In other words, in the latter embodiments a default time can be initiated but without a minimum pulse time.

If a memory operation is not completed on a given memory cell at the end of a pulse time, additional pulses can be implemented until sensing circuitry detects the memory cell completes the memory operation. In an alternative embodiment, the initial pulse time can be maintained until completion of the memory operation is detected. A second memory cell of Block$_1$ (starting from the left of the diagram) required a t$_2$ 424 pulse time, longer than the t$_1$ 422 pulse time to complete the memory operation. Still other memory cells involved a t$_1$ 426 pulse time, where t$_2$>t$_1$>t$_0$, for completion of the memory operation. In contrast, pulse times for Block$_2$ 202B are all the default to pulse time 422, whereas Block$_Z$ 202C has a few t$_1$ 426 pulse times, but no t$_2$ 424 pulse times.

Because source drivers 240A-240C are configured to progress to subsequent bitlines (and memory cells) independent of other source drivers 240A-240C, in a given time T$_1$ 450 a different number of memory cells can be completed for each memory block 202A-202C. For Block$_1$ 202A, a fourteenth memory cell 412A (counting the number of completed pulses) is completed at time T$_1$ 250, whereas for Block$_2$ 202B a seventeenth memory cell 412B has been completed. Whereas for Block$_Z$ 202C, a fifteenth memory cell 412Z is completed by time T$_1$ 250.

According to one or more embodiments, source drivers 240A-240C can be connected to different blocks when finished operating on all memory cells of a given block. In some embodiments, a source driver 240B can operate on a memory block 202A at which another source driver 240A is currently operating, to complete that memory block 202A more quickly. In other embodiments, the source driver 240B can be directed to a memory block (not depicted) to which a source driver is not currently assigned.

Figure 5:
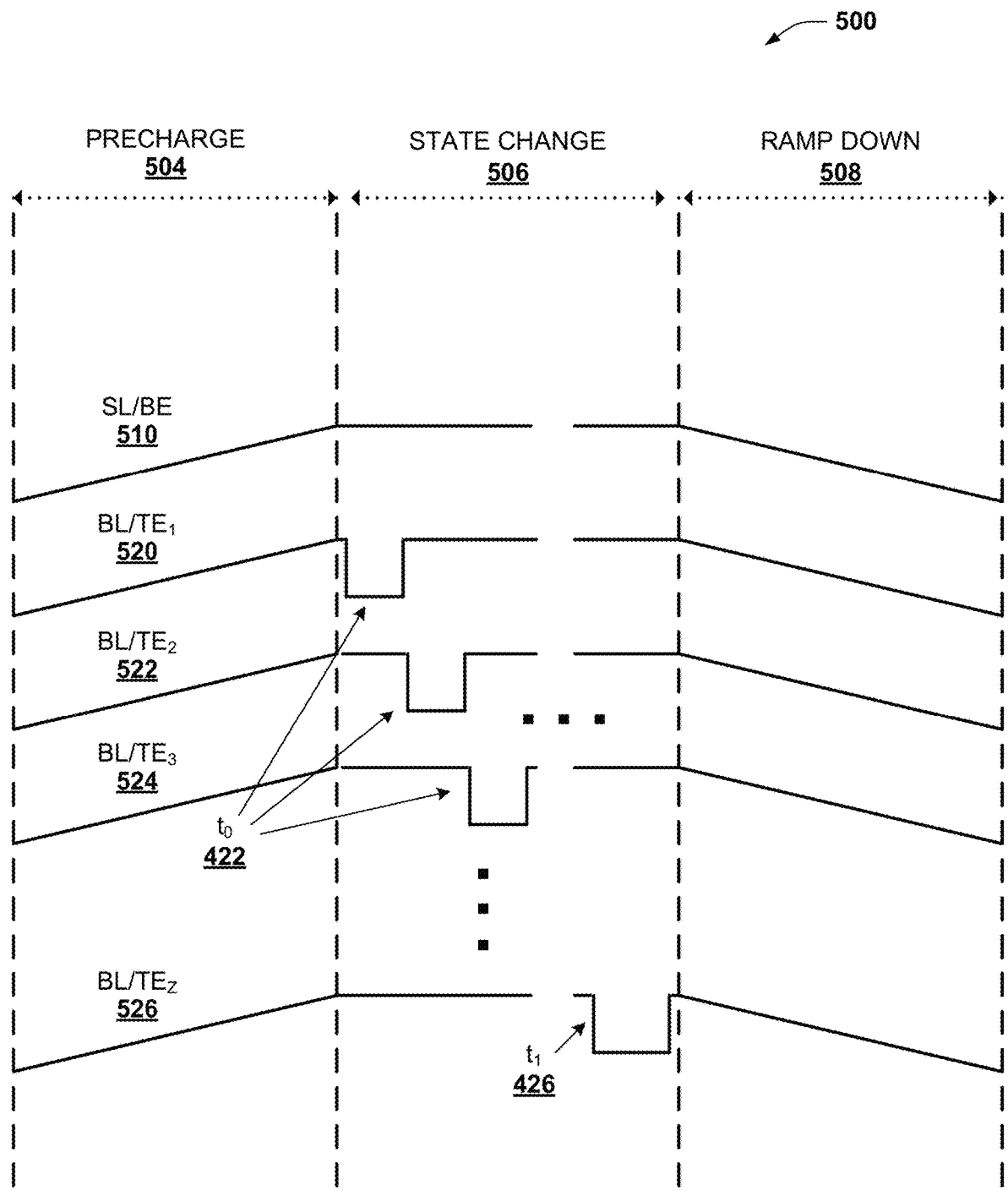
FIG. 5 illustrates a signal timing sequence diagram for multiple two-terminal memory cells facilitating improved operation times, in other embodiments.

FIG. 5 depicts an example timing diagram 500 for memory operations for pluralities of memory devices, in disclosed embodiments. Timing diagram 500 facilitates reduced program/erase operation times on pluralities of memory devices according to further embodiments of the present disclosure. For instance, where precharge time 504 (increasing signal, e.g., before initiation of a set of memory operation) and ramp down time 508 (decreasing signal, e.g., following the set of memory operations) have comparable duration as the state change time 506, applying a state change signal to multiple memory devices within the state change time 506 can significantly reduce program/erase durations for the plurality of memory devices.

As an illustrative example, consider a 1.6 us precharge time 504, a 1.6 us state change time 506 and a 1.6 us ramp down time 508. To initiate and complete a memory operation on a single memory cell given all of these times are fixed, would require 3×1.6 us, or 4.8 us. However, some two-terminal memory technologies can program or erase in a small fraction of this time (e.g., about 20 ns erase time, as one example for some resistance random access memory). For fixed times 504, 506, 508, however, the operation speed of the two-terminal memory is not realized by the operation circuitry. However, for a bulk operation when multiple memory cells are programmed or erased in a state change time 506, the average operation time per cell can be reduced significantly. During state change time 506, the operation signal is applied to a first bitline/top electrode (BL/TE$_1$) 520, then to a second BL/TE$_2$ 522, a third BL/TE$_3$ 524, and so on up to a Z$^{th}$ BL/TE$_Z$ 526, as illustrated. If average operation time is 20 ns, for example, a number of cells equal to 1.6 us (1600 ns)/20 ns can be completed, or 80 memory cells. Completion of 80 memory cells in the same 4.6 us significantly reduces the per cell operation from 4.6 us per cell to 57.5 ns per cell.

In the embodiment of FIG. 5, pulse times are modular, having a default time t$_0$ 422, and multiples of (e.g., double) the default time, such as t$_1$ 426. Other embodiments within the scope of the present disclosure will not have modular times, such as when a pulse cycle is terminated in response to detection of a memory operation (e.g., on a following clock cycle, e.g., 10 ns for a 100 Mhz clock, 2 ns for a 500 Mhz clock, or even faster for high speed clocks). Upon termination of the pulse time, a new memory cell can be targeted thereafter (e.g., on a subsequent clock cycle(s), as suitable).

FIG. 6 illustrates a sample schematic diagram of a multiplexer 600 according to one or more additional embodiments of the present disclosure. Multiplexer 600 can be configured to selectively connect a source driver (e.g., source drivers 240A-240C) to a bitline of a block of memory. Multiplexer 600 depicts a first set of bitlines BL$_{<0>}$ 602, BL$_{<1>}$ 604, BL$_{<2>}$ 606, . . . , BL$_{<Z>}$ 608, referred to collectively as bitlines 602-608, of a single block of memory. However, it should be appreciated that multiplexer can incorporate bitlines of multiple blocks of memory as well (e.g., bitlines BL2<0:X> 208B, BLZ<0:X> 208C, as well as others not depicted herein).

Driver switches 610 are provided to connect a source driver to a bitline of bitlines 602-608. In some embodiments, multiple source drivers can be connected to any of bitlines 602-608 (e.g., by way of a driver mux—not depicted). In other embodiments, however, each source driver can be connected only to bitlines of a single memory block.

In various embodiments, a sensing circuit 618 is provided for sensing current on one or more bitlines 602-608 to determine when a memory operation is complete. For instance, sensing circuit 618 can compare a current flowing in a bitline to a current threshold and identify a change in the current suitable to cross the current threshold. For a program operation, sensing circuit 618 can detect an increase in current flowing in the bitline above the current threshold, and set a program flag to notify an associated source driver of the detected program event. For an erase operation, sensing circuit 618 can detect a decrease in current flowing in the bitline below the current threshold, and set an erase flag to notify the associated source driver of the detected erase event. Sensing circuit 618 can be connected to selected bitlines by way of sense contact 614.

In alternative or additional embodiments, multiplexer 600 can comprise a bias signal to provide a bias to current detected by sensing circuit 618. Bias signal 616 can be configured to have a magnitude suitable to reduce effects of noise on sensing circuit 618 when detecting current in a bitline 602-608. In such case, sensing circuit 618 compares the current flow to a threshold current that includes the bias current as a constant. As an illustrative example, current flow can be biased by about 1 microamp (uA) to about 3 uA, or any other suitable value. In this example, using a 1 uA bias current, a constant 1 uA is added to a threshold current utilized by sensing circuit 618. In the case where current flowing through an average/median/typical, etc. erased cell is about 50 nA and current flowing through the average/media/typical, etc., programmed cell is about 200 nA, a baseline current threshold for measurably distinguishing the erased cell from the programmed cell can be, for example, 120 nA. When added to the 1 uA bias current, sensing circuit 618 will detect a current on bitline 602-608 above or below 1.12 uA to distinguish erased cells from programmed cells. This bias current will help to mitigate effects of low signal noise in an electronic device, enhancing accuracy of sensing circuit 618.

The diagrams included herein are described with respect to interaction between several memory cells, memory cell components, memory arrays or memory architectures. It should be appreciated that such diagrams can include those memory cells, components, arrays and architectures specified therein, some of the specified memory cells/components/arrays/architectures, or suitable alternative or additional memory cells/components/arrays/architectures. Sub-components can also be implemented as electrically connected to other sub-components rather than included within a parent architecture. Likewise, individual components can be implemented in a combined architecture according to other embodiments. For instance, source drivers 240A-240C can be implemented as sub-components of a single voltage/current driver, in an embodiment. Moreover, some of the disclosed embodiments can be implemented as part(s) of other disclosed embodiments where suitable.

Still further, one or more disclosed processes can be combined into a single process providing aggregate functionality. For instance, a program or erase process can comprise a read/verify process, or vice versa, to facilitate programming/erasing a semiconductor cell and verifying completion of the programming/erasing by way of a single process. In addition, it should be appreciated that respective rows of multiple cell memory architectures can be erased in groups (e.g., multiple rows erased concurrently) or individually. Moreover, it should be appreciated that multiple memory cells on a particular row can be read or programmed in groups (e.g., multiple memory cells read/programmed concurrently) or individually. Components of the disclosed architectures can also interact with one or more other components not specifically described herein but known by those of skill in the art or made evident by way of the context provided herein.

Figure 7:
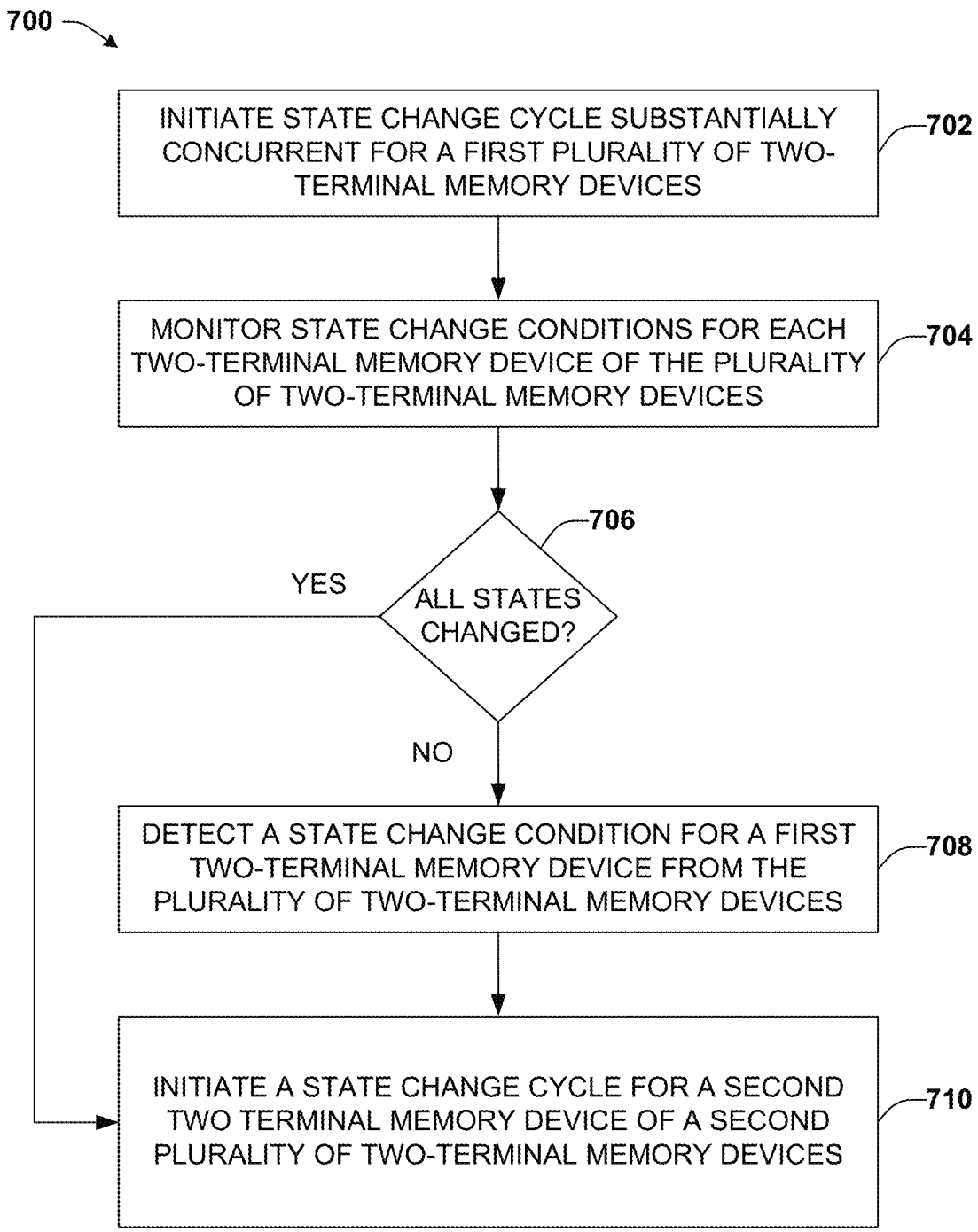
FIG. 7 illustrates a flowchart of a sample method for programming or erasing blocks of memory cells according to disclosed embodiments.
Figure 8:
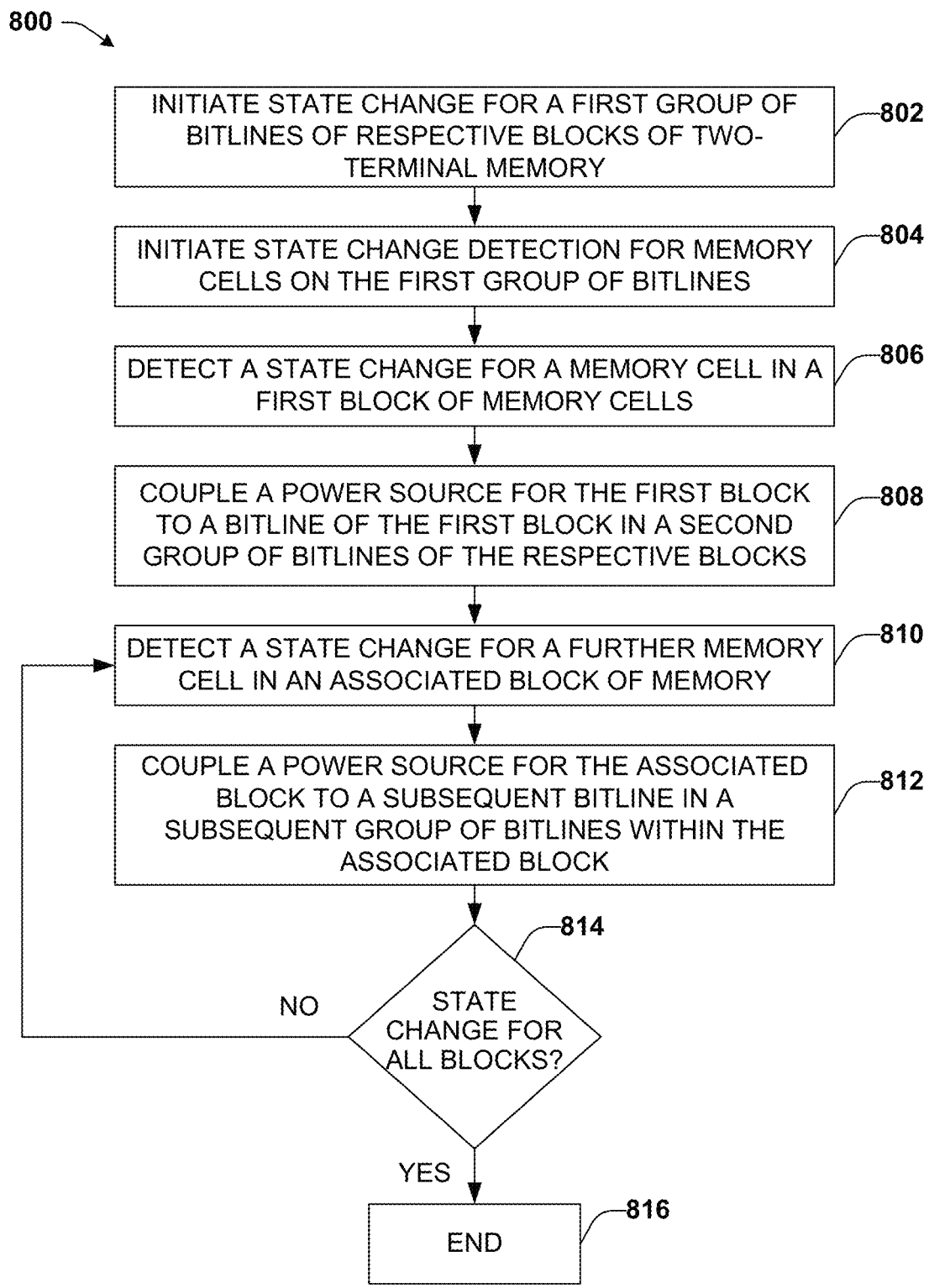
FIG. 8 illustrates a flowchart of an example method for implementing memory operations on two-terminal memory devices according to further embodiments.

In view of the exemplary diagrams described herein, process methods that can be implemented in accordance with the disclosed subject matter will be better appreciated with reference to the flow charts of FIGS. 7 and 8. While for purposes of simplicity of explanation, the methods of FIGS. 7 and 8 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein, and in some embodiments additional method steps not depicted but known to one skill in the art or made known by way of the context provided herein, can be incorporated into the described methods. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Referring now to FIG. 7, there is depicted a flowchart of an example method 700 for facilitating erase or program operations on two-terminal memory device, according to further embodiments of the present disclosure. Method 700 can comprise, at 702, substantially simultaneously initiating erase cycle or program cycle for two-terminal memory devices from a first plurality of two-terminal memory devices. In an embodiment, the first plurality of two-terminal memory devices can comprise memory cells on respective zeroth bitlines in different blocks of the two-terminal memory device. At 704, method 700 can comprise monitoring erase detect or program detect conditions for each of the two-terminal memory devices in the first plurality. Additionally, at 706 and before detecting erase detect or program detect conditions for all of the two-terminal memory devices of the first plurality of two-terminal memory devices, method 700 can comprise detecting an erase detect or a program detect condition for a first two-terminal memory device from the first plurality of two-terminal memory devices. Additionally, at 708, and also before detecting erase detect or program detect conditions for all two-terminal memory devices of the first plurality, method 700 can comprise initiating an erase cycle or a program cycle for a second two-terminal memory device for a second plurality of two-terminal memory devices. This latter erase cycle or program cycle can be in response to detecting the erase detect or program detect condition for the first two-terminal memory device. The second plurality of two-terminal memory devices can include memory devices on respective first order bitlines of the different blocks of the two-terminal memory device, as described herein.

In further embodiments, before detecting erase detect or program detect conditions for all of the two-terminal memory devices, method 700 can further comprise detecting the erase detect or program detect condition for a third two-terminal memory device from the first plurality of two-terminal memory devices. Additionally, method 700 can comprise initiating the erase cycle or the program cycle for a fourth two-terminal memory device for the second plurality of two-terminal memory devices, in response to detecting the erase detect or program detect condition for the third two-terminal memory device.

In still further embodiments, detecting the erase detect or program detect condition for the first two-terminal memory device from the first plurality of two-terminal memory devices can include performing a verify cycle for the first two-terminal memory device to determine a success condition or lack of success condition. Moreover, in other embodiments initiating the erase cycle or the program cycle for the second two-terminal memory device for the second plurality of two-terminal memory devices is in response to detecting the erase detect or program detect condition for the first two-terminal memory device and to determining the success condition.

In alternative or additional embodiments of method 700, initiating the erase cycle or the program cycle for the second two-terminal memory device for the second plurality of two-terminal memory devices is substantially free of a verify cycle for the first two-terminal memory device from the first plurality of two-terminal memory devices. According to such embodiments, the verify cycle can be selected from a group consisting of: an erase verify cycle and a program verify cycle.

In a further embodiment, detecting the erase detect or the program detect condition for the first two-terminal memory device from the first plurality of two-terminal memory devices comprises receiving a current flow associated with the first two-terminal memory device. In this latter embodiment, method 700 can further comprise biasing the current flow with a current offset to form a biased current flow and comparing the biased current flow against a current threshold to detect the erase detect or program detect condition. Still further, the detecting the erase detect or program detect condition in response to the sensed current comprises can comprise detecting an erase detect condition when the sensed current is less than the current threshold. Alternatively, the detecting the erase detect or program detect condition in response to the sensed current comprises can comprise detecting a program detect condition when the sensed current is larger than the current threshold.

In still other embodiments, the two-terminal memory devices comprise resistive random access (ReRAM) devices. In such embodiment, the monitoring erase detect or program detect conditions for each of the two-terminal memory devices can comprise monitoring erase detect or program detect conditions for each of the ReRAM devices.

In yet another embodiment, the two-terminal memory devices are selected from a group consisting of: phase change memory, metal oxide memory, silicon sub-oxide memory, chalcogenide memory, magnetic memory, carbon nanotube memory, and filamentary-based memory. In other embodiments, after detecting erase detect or program detect conditions for a last two-terminal memory device of the first plurality of two-terminal memory devices method 700 can include initiating an erase cycle or a program cycle for a third two-terminal memory device for the second plurality of two-terminal memory devices, in response to detecting the erase detect or program detect condition for the last two-terminal memory device of the first plurality of two-terminal memory devices. In at least one disclosed embodiment, a number of two-terminal memory devices from the first plurality of two-terminal memory devices is within a range of 8 to 32.

FIG. 8 depicts a flowchart of an example method 800 for implementing additional aspects of the present disclosure. At 802, method 800 can comprise initiating a state change operation for memory cells connected to a first group of bitlines in respective memory blocks of a two-terminal memory. At 804, method 800 can comprise initiating state change detection for the memory cells on the first group of bitlines. Additionally, at 806, method 800 can comprise detecting a state change for a memory cell in the first block of memory cells, and at 808, method 800 can comprise coupling a power source for the first memory block to a bitline of the first memory block that belongs to a second group of bitlines of the respective memory blocks. At 810, method 800 can comprise detecting a state change for a further memory cell in a memory block associated with the further memory cell. At 812, method 800 can comprise coupling a power source for the associated memory block to a subsequent bitline in a subsequent group of bitlines within the associated memory block. At 814, a determination is made as to whether all memory devices of the blocks of memory have successfully changed state. If yes, method 800 can end at 816. Otherwise, method 800 returns to reference number 810.

Example Operating Environments

Figure 9:
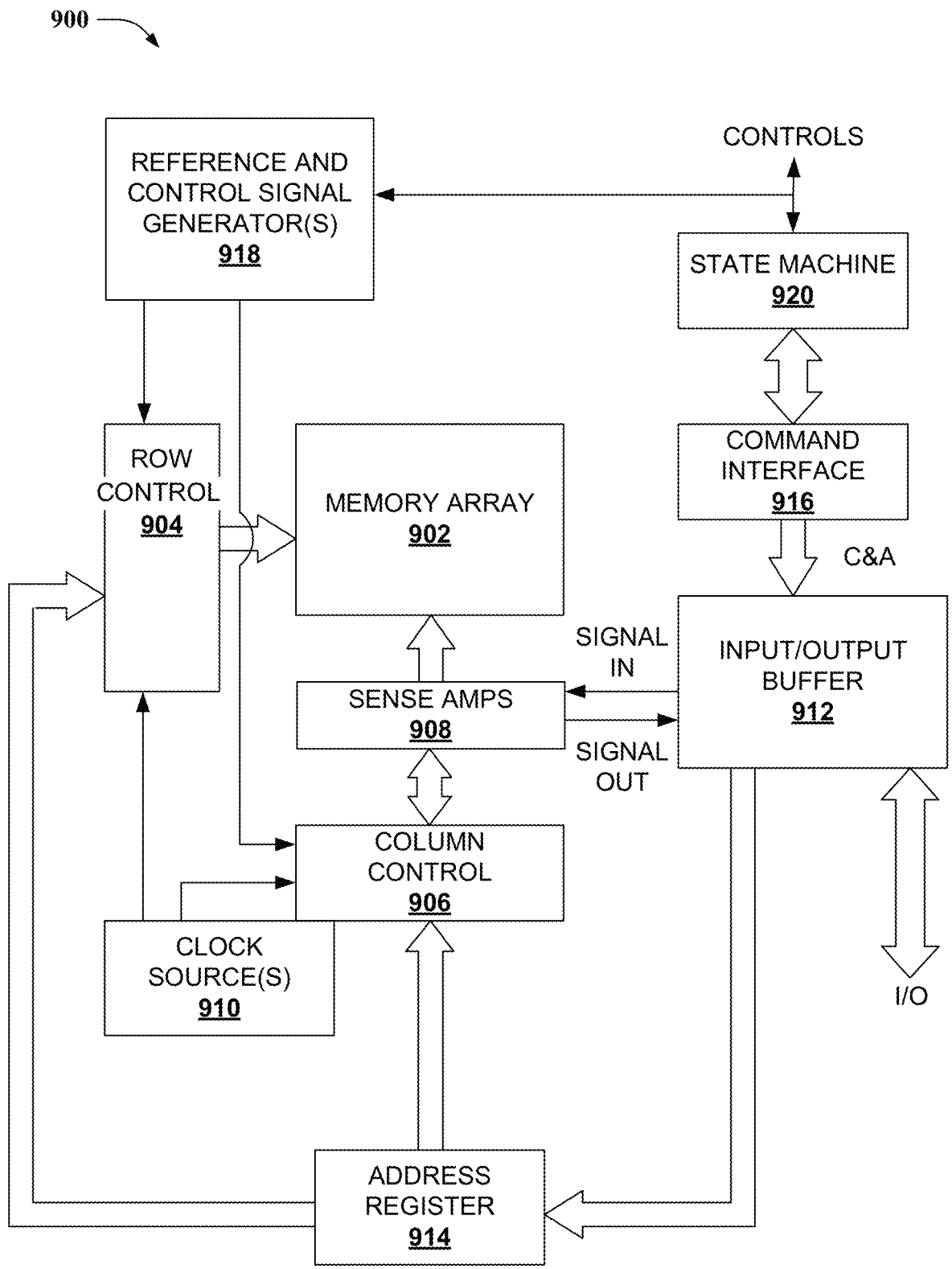
FIG. 9 illustrates a block diagram of a sample electronic operating environment in accordance with certain embodiments presented herein.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of semiconductor architectures and process methodologies for operating arrays of two-terminal memory devices, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects can also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 9 illustrates a block diagram of an example operating and control environment 900 for a memory array 902 of a multi-block memory cell array according to aspects of the subject disclosure. In at least one aspect of the subject disclosure, memory array 902 can comprise memory selected from a variety of memory cell technologies. In at least one embodiment, memory array 902 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In yet another embodiment, memory array 902 can be configured to operate according to bulk program or erase operations as provided herein.

A column controller 906 and sense amps 908 can be formed adjacent to memory array 902. Moreover, column controller 906 can be configured to activate (or identify for activation) a subset of bitlines of memory array 902. Column controller 906 can utilize a control signal provided by a reference and control signal generator(s) 918 to activate, as well as operate upon, respective ones of the subset of bitlines, applying suitable program, erase or read voltages to those bitlines. Non-activated bitlines can be kept at an inhibit voltage (also applied by reference and control signal generator(s) 918), to mitigate or avoid bit-disturb effects on these non-activated bitlines.

In addition, operating and control environment 900 can comprise a row controller 904. Row controller 904 can be formed adjacent to and electrically connected with word lines (and sourcelines, in some embodiments) of memory array 902. Further, utilizing control signals of reference and control signal generator(s) 918, row controller 904 can select particular rows of memory cells with a suitable selection voltage. Moreover, row controller 904 can facilitate program, erase or read operations by applying suitable voltages at selected word lines (and sourcelines). Similar to column controller 906, row controller 904 can apply an inhibit voltage to non-activated wordlines (sourcelines) to migiate or avoid bit-disturb effects on the non-activated wordlines (sourcelines).

Sense amps 908 can read data from, or write data to the activated memory cells of memory array 902, which are selected by column control 906 and row control 904. Data read out from memory array 902 can be provided to an input and input/output buffer 912. Likewise, data to be written to memory array 902 can be received from the input and input/output buffer 912 and written to the activated memory cells of memory array 902.

A clock source(s) 910 can provide respective clock pulses to facilitate timing for read, write, and program operations of row controller 904 and column controller 906. Clock source(s) 910 can further facilitate selection of wordlines or bitlines in response to external or internal commands received by operating and control environment 900. Input and input/output buffer 912 can comprise a command and address input, as well as a bidirectional data input and output. Instructions are provided over the command and address input, and the data to be written to memory array 902 as well as data read from memory array 902 is conveyed on the bidirectional data input and output, facilitating connection to an external host apparatus, such as a computer or other processing device (not depicted, but see e.g., computer 1002 of FIG. 10, infra).

Input and input/output buffer 912 can be configured to receive write data, receive an erase instruction, receive a status or maintenance instruction, output readout data, output status information, and receive address data and command data, as well as address data for respective instructions. Address data can be transferred to row controller 904 and column controller 906 by an address register 910. In addition, input data is transmitted to memory array 902 via signal input lines between sense amps 908 and input and input/output buffer 912, and output data is received from memory array 902 via signal output lines from sense amps 908 to input and input/output buffer 912. Input data can be received from the host apparatus, and output data can be delivered to the host apparatus via the I/O bus.

Commands received from the host apparatus can be provided to a command interface 916. Command interface 916 can be configured to receive external control signals from the host apparatus, and determine whether data input to the input and input/output buffer 912 is write data, a command, or an address. Input commands can be transferred to a state machine 920.

State machine 920 can be configured to manage programming and reprogramming of memory array 902 (as well as other memory banks of the multi-bank memory array). Instructions provided to state machine 920 are implemented according to control logic configurations, enabling state machine 920 to manage read, write, erase, data input, data output, and other functionality associated with memory array 902. In some aspects, state machine 920 can send and receive acknowledgments and negative acknowledgments regarding successful receipt or execution of various commands. In further embodiments, state machine 920 can decode and implement status-related commands, decode and implement configuration commands, and so on.

To implement read, write, erase, input, output, etc., functionality, state machine 920 can control clock source(s) 908 or reference and control signal generator(s) 918. Control of clock source(s) 908 can cause output pulses configured to facilitate row controller 904 and column controller 906 implementing the particular functionality. Output pulses can be transferred to selected bitlines by column controller 906, for instance, or wordlines by row controller 904, for instance.

Figure 10:
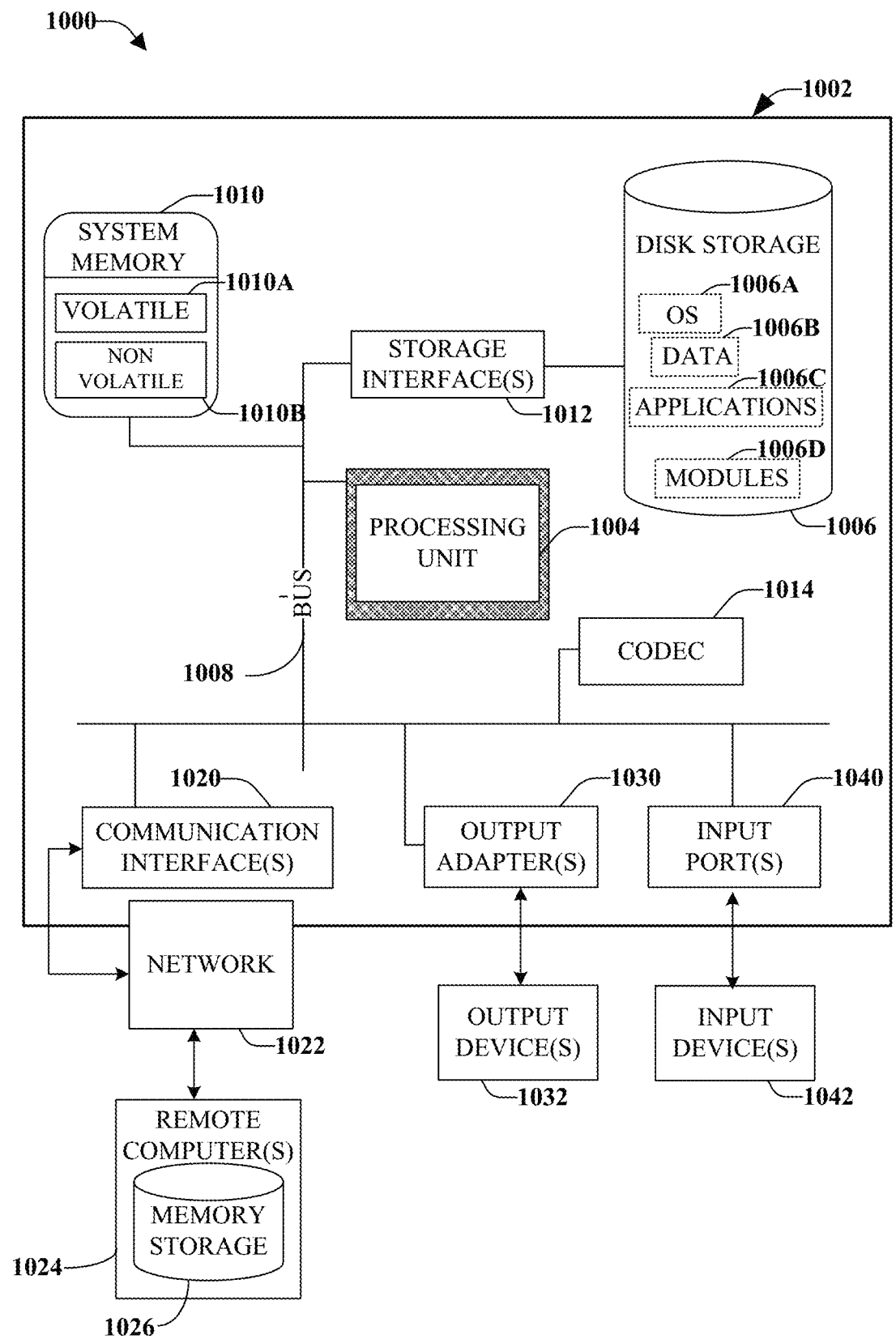
FIG. 10 depicts a block diagram of an example computing environment for implementing one or more disclosed embodiments of the present disclosure.

With reference to FIG. 10, a suitable environment 1000 for implementing various aspects of the claimed subject matter includes a computer 1002. The computer 1002 includes a processing unit 1004, a system memory 1010, a codec 1014, and a system bus 1008. The system bus 1008 couples system components including, but not limited to, the system memory 1010 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1010 includes volatile memory 1010A and non-volatile memory 1010B. The basic input/output system (BIOS), containing the basic routines to transfer information between elements within the computer 1002, such as during start-up, is stored in non-volatile memory 1010B. In addition, according to present innovations, codec 1014 may include at least one of an encoder or decoder, wherein the at least one of an encoder or decoder may consist of hardware, software, or a combination of hardware and software. Although, codec 1014 is depicted as a separate component, codec 1014 may be contained within non-volatile memory 1010B. By way of illustration, and not limitation, non-volatile memory 1010B can include read only memory (ROM), programmable ROM (PROM), electrically programmable ROM (EPROM), electrically erasable programmable ROM (EEPROM), or flash memory, two-terminal memory, and so on. Volatile memory 1010A includes random access memory (RAM), which acts as external cache memory. According to present aspects, the volatile memory may store the write operation retry logic (not shown in FIG. 10) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1002 may also include removable/non-removable, volatile/non-volatile computer storage medium. FIG. 10 illustrates, for example, disk storage 1006. Disk storage 1006 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1006 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1006 to the system bus 1008, a removable or non-removable interface is typically used, such as storage interface 1012. It is appreciated that storage devices 1006 can store information related to a user. Such information might be stored at or provided to a server or to an application running on a user device. In one embodiment, the user can be notified (e.g., by way of output device(s) 1032) of the types of information that are stored to disk storage 1006 or transmitted to the server or application. The user can be provided the opportunity to opt-in or opt-out of having such information collected and/or shared with the server or application (e.g., by way of input from input device(s) 1042).

It is to be appreciated that FIG. 10 describes software that acts as an intermediary between users and the basic computer resources described in the suitable operating environment 1000. Such software includes an operating system 1006A. Operating system 1006A, which can be stored on disk storage 1006, acts to control and allocate resources of the computer system 1002. Applications 1006C take advantage of the management of resources by operating system 1006A through program modules 1006D, and program data 1006D, such as the boot/shutdown transaction table and the like, stored either in system memory 1010 or on disk storage 1006. It is to be appreciated that the claimed subject matter can be implemented with various operating systems or combinations of operating systems.

A user enters commands or information into the computer 1002 through input device(s) 1042. Input devices 1042 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via input port(s) 1040. Input port(s) 1040 include, for example, a serial port, a parallel port, a game port, and a universal serial bus (USB). Output device(s) 1032 use some of the same type of ports as input device(s) 1042. Thus, for example, a USB port may be used to provide input to computer 1002 and to output information from computer 1002 to an output device 1032. Output adapter 1030 is provided to illustrate that there are some output devices 1032 like monitors, speakers, and printers, among other output devices 1032, which require special adapters. The output adapters 1030 include, by way of illustration and not limitation, video and sound cards that provide a means of connection between the output device 1032 and the system bus 1008. It should be noted that other devices and/or systems of devices provide both input and output capabilities such as remote computer(s) 1038.

Computer 1002 can operate in a networked environment using logical connections to one or more remote computers, such as remote computer(s) 1024. The remote computer(s) 1024 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1026 is illustrated with remote computer(s) 1024. Remote computer(s) 1024 is logically connected to computer 1002 through a network 1022 and then connected via communication interface(s) 1020. Network 1022 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication interface(s) 1020 refers to the hardware/software employed to connect the network 1022 to the bus 1008. While communication interface(s) 1020 is shown for illustrative clarity inside computer 1002, it can also be external to computer 1002. The hardware/software necessary for connection to the network 1022 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments include a system as well as a computer-readable medium having computer-executable instructions for performing the acts and/or events of the various processes.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further embodiments can be envisioned to one of ordinary skill in the art after reading this disclosure. For example, in various embodiments, erase operations may be initiated upon a plurality of ReRAM devices (e.g. 16, 32, etc.) at the same time.

In other embodiments, combinations or sub-combinations of the above disclosed embodiments can be advantageously made. The block diagrams of the architecture and flow charts are grouped for ease of understanding. However, it should be understood that combinations of blocks, additions of new blocks, re-arrangement of blocks, and the like are contemplated in alternative embodiments of the present disclosure.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for facilitating erase or program operations on two-terminal memory devices comprising:
substantially simultaneously initiating erase cycle or program cycle for two-terminal memory devices from a first plurality of two-terminal memory devices, wherein substantially simultaneously initiating the erase cycle or the program cycle for the two-terminal memory devices is within a time frame selected from a group consisting of: concurrent, within a same clock cycle, and within an adjacent clock cycle;
monitoring erase detect or program detect conditions for each of the two-terminal memory devices; and
before detecting erase detect or program detect conditions for all of the two-terminal memory devices, the method includes:
detecting an erase detect or a program detect condition for a first two-terminal memory device from the first plurality of two-terminal memory devices; and
initiating an erase cycle or a program cycle for a second two-terminal memory device for a second plurality of two-terminal memory devices, in response to detecting the erase detect or program detect condition for the first two-terminal memory device.

2. The method of claim 1 wherein before detecting erase detect or program detect conditions for all of the two-terminal memory devices, the method includes:
detecting the erase detect or program detect condition for a third two-terminal memory device from the first plurality of two-terminal memory devices; and
initiating the erase cycle or the program cycle for a fourth two-terminal memory device for the second plurality of two-terminal memory devices, in response to detecting the erase detect or program detect condition for the third two-terminal memory device.

3. The method of claim 1
wherein after detecting the erase detect or program detect condition for the first two-terminal memory device from the first plurality of two-terminal memory devices, the method includes performing a verify cycle for the first two-terminal memory device to determine a success condition or lack of success condition; and
wherein the initiating the erase cycle or the program cycle for the second two-terminal memory device for the second plurality of two-terminal memory devices is in response to detecting the erase detect or program detect condition for the first two-terminal memory device and to determining the success condition.

4. The method of claim 1 wherein the initiating the erase cycle or the program cycle for the second two-terminal memory device for the second plurality of two-terminal memory devices is free of a verify cycle for the first two-terminal memory device from the first plurality of two-terminal memory devices.

5. The method of claim 4 wherein the verify cycle is selected from a group consisting of: an erase verify cycle and a program verify cycle.

6. The method of claim 1 wherein the detecting the erase detect or the program detect condition for the first two-terminal memory device from the first plurality of two-terminal memory devices comprises:
receiving a current flow associated with the first two-terminal memory device;
biasing the current flow with a current offset to form a biased current flow;
comparing the biased current flow against a current threshold to detect the erase detect or program detect condition.

7. The method of claim 6 wherein the detecting the erase detect or program detect condition in response to the sensed current comprises:
detecting an erase detect condition when the sensed current is less than the current threshold; or
detecting a program detect condition when the sensed current is larger than the current threshold.

8. The method of claim 1
wherein the two-terminal memory devices comprise resistive random access (ReRAM) devices; and
wherein the monitoring erase detect or program detect conditions for each of the two-terminal memory devices comprises monitoring erase detect or program detect conditions for each of the ReRAM devices.

9. The method of claim 1 wherein the two-terminal memory devices are selected from a group consisting of: phase change memory, metal oxide memory, silicon sub-oxide memory, chalcogenide memory, magnetic memory, carbon nanotube memory, and filamentary-based memory.

10. The method of claim 1 wherein after detecting erase detect or program detect conditions for a last two-terminal memory device of the first plurality of two-terminal memory devices, the method includes:

initiating an erase cycle or a program cycle for a third two-terminal memory device for the second plurality of two-terminal memory devices, in response to detecting the erase detect or program detect condition for the last two-terminal memory device of the first plurality of two-terminal memory devices; and wherein a number of two-terminal memory devices from the first plurality of two-terminal memory devices is within a range of 8 to 32.

11. A semiconductor device comprises:

a first plurality of two-terminal memory devices;

a second plurality of two-terminal memory devices;

a state adjustment initiation portion coupled to the first plurality of two-terminal memory devices and to the second plurality of two-terminal memory devices, wherein the state adjustment initiation portion is configured to initiate bringing each two-terminal memory device from the first plurality of two-terminal memory devices to a pre-determined state, wherein the pre-determined state is selected from a group consisting of: erase state and program state;

a detection portion coupled to the first plurality of two-terminal memory devices and to the state adjustment initiation portion, wherein the detection portion is configured to simultaneously or substantially simultaneously detect whether an adjustment success condition occurs for every two-terminal memory device from the first plurality of two-terminal memory devices, wherein substantially simultaneously detecting whether an adjustment success condition occurs is within a time frame selected from a group consisting of: concurrent, within a same clock cycle, and within an adjacent clock cycle;

wherein the state adjustment initiation portion is also configured to initiate bringing a first two-terminal memory device from the second plurality of two-terminal memory devices to the pre-determined state, in response to detection of an adjustment success condition for a second two-terminal memory device from the first plurality of two-terminal memory devices and before detection of adjustment success conditions for all two-terminal memory devices from the first plurality of two-terminal memory devices.

12. The semiconductor device of claim 11 wherein the state adjustment initiation portion is also configured to initiate bringing a third two-terminal memory device from the second plurality of two-terminal memory devices to the pre-determined state, in response to detection of an adjustment success condition for a fourth two-terminal memory device from the first plurality of two-terminal memory devices and before detection of adjustment success conditions for all two-terminal memory devices from the first plurality of two-terminal memory devices.

13. The semiconductor device of claim 11 further comprising:

a verify portion coupled to the first plurality of two-terminal memory devices, to the second plurality of two-terminal memory devices, to the state adjustment initiation portion, and to the detection portion, wherein the verify portion is configured to verify that the pre-determined state is reached for every two-terminal memory device from the first plurality of two-terminal memory devices; and wherein the state adjustment initiation portion is also configured to initiate bringing the first two-terminal memory device from the second plurality of two-terminal memory devices to the pre-determined state, in response to the detection of the adjustment success condition for the second two-terminal memory device from the first plurality of two-terminal memory devices and in response to the verify portion verifying that the pre-determined state is reached for the second two-terminal memory device.

14. The semiconductor device of claim 11 wherein the state adjustment initiation portion is configured to initiate bringing the first two-terminal memory device from the second plurality of two-terminal memory devices to the pre-determined state, free of a verification of the pre-determined state.

15. The semiconductor device of claim 14 wherein a verify cycle associated with the verification of the pre-determined state is selected from a group consisting of: an erase verify cycle and a program verify cycle.

16. The semiconductor device of claim 11 wherein the detection portion comprises:

a first input configured for receiving a current flow associated with the second two-terminal memory device;

a biasing circuit coupled to the first input and configured to bias the current flow with a current offset to form a biased current flow;

a comparator coupled to the biasing circuit and configured compare the biased current flow against a threshold current to determine a sensed current flow; and a detector circuit coupled to the comparator and configured to determine the adjustment success condition in response to the sensed current flow.

17. The semiconductor device of claim 16 wherein the detector circuit is configured to determine the adjustment success condition when the sensed current is less than a first threshold current, or wherein the detector is configured to determine the adjustment success condition when the sensed current is larger than a second threshold current.

18. The semiconductor device of claim 11 wherein the first plurality of two-terminal memory devices comprises resistive random access (ReRAM) devices.

19. The semiconductor device of claim 11 wherein the first plurality of two-terminal memory devices is selected from a group consisting of: phase change memory, metal oxide memory, silicon sub-oxide memory, chalcogenide memory, magnetic memory, carbon nanotube memory, and filamentary-based memory.

20. The semiconductor device of claim 11 wherein a number of two-terminal memory devices in the first plurality of two-terminal memory devices is within a range of 8 to 32.

* * * * *